(12) United States Patent
Wessels et al.

(10) Patent No.: US 8,847,347 B2
(45) Date of Patent: Sep. 30, 2014

(54) INTEGRATED CIRCUIT AND IC MANUFACTURING METHOD

(71) Applicant: NXP B.V., Eindhoven (NL)

(72) Inventors: Piet Wessels, Nijmegen (NL); Nico Berckmans, Wijchen (NL); Khin Hoong Lim, Singapore (SG); Michael John Ben Bolt, Arnhem (NL); Jerome Guillaume Anna Dubois, Singapore (SG); Naveen Agrawal, Rajasthan (IN); Gaurav Singh Bisht, Pasir ris (SG); Jayaraj Thillaigovindan, Tamilnadu (IN); Jie Liao, Boise, ID (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/687,172

(22) Filed: Nov. 28, 2012

(65) Prior Publication Data

US 2013/0154050 A1    Jun. 20, 2013

(30) Foreign Application Priority Data

Dec. 5, 2011  (EP) .................................. 11191998

(51) Int. Cl.
*H01L 29/00*  (2006.01)
*H01L 21/762*  (2006.01)
*H01L 29/06*  (2006.01)

(52) U.S. Cl.
CPC .... *H01L 21/76224* (2013.01); *H01L 21/76283* (2013.01); *H01L 29/0649* (2013.01)
USPC ......................................... 257/508; 438/424

(58) Field of Classification Search
USPC .......................................... 257/508; 438/424
See application file for complete search history.

(56) References Cited

U.S. PATENT DOCUMENTS

| | | | |
|---|---|---|---|
| 6,429,502 B1 | 8/2002 | Librizzi et al. | |
| 8,154,104 B2 * | 4/2012 | Shin et al. | 257/536 |
| 8,330,199 B2 * | 12/2012 | Kamakura et al. | 257/300 |
| 8,482,100 B2 * | 7/2013 | Cho | 257/538 |
| 2005/0212071 A1 | 9/2005 | Yue et al. | |
| 2011/0045652 A1 * | 2/2011 | Yue et al. | 438/454 |
| 2012/0326699 A1 * | 12/2012 | Swanenberg et al. | 324/76.11 |
| 2013/0299944 A1 * | 11/2013 | Lai et al. | 257/586 |

FOREIGN PATENT DOCUMENTS

| | | |
|---|---|---|
| EP | 1 180 800 A2 | 2/2002 |
| EP | 1 367 717 A1 | 12/2003 |

OTHER PUBLICATIONS

Ytterdal, Trond, et al.; "Device Modeling for Analog and RR CMOS Circuit Design—Chapter 11.2"; John Wiley & Sons Ltd, Chichester, England; 10 pages (2003).

Extended European Search Report for application No. 11191998.1 (May 16, 2012).

* cited by examiner

*Primary Examiner* — Phuc Dang

(57) ABSTRACT

Disclosed is an integrated circuit die comprising an active substrate including a plurality of components laterally separated from each other by respective isolation structures, at least some of the isolation structures carrying a further component, wherein the respective portions of the active substrate underneath the isolation structures carrying said further components are electrically insulated from said components. A method of manufacturing such an IC die is also disclosed.

9 Claims, 5 Drawing Sheets

INTEGRATED CIRCUIT AND IC MANUFACTURING METHOD

CROSS-REFERENCE TO RELATED APPLICATIONS

This application claims the priority under 35 U.S.C. §119 of European patent application no. 11191998.1, filed on Dec. 5, 2011 the contents of which are incorporated by reference herein.

FIELD OF THE INVENTION

The present invention relates to an integrated circuit die comprising an active substrate including a plurality of components laterally separated from each other by respective isolation trenches, at least some of the isolation trenches carrying a further component.

The present invention further relates to a method of manufacturing such an integrated circuit.

BACKGROUND OF THE INVENTION

It is well-known that there exists an ongoing need to miniaturize the footprint of integrated circuits (ICs), whilst at the same time increasing the complexity of such ICs. In other words, there exists a need to integrate more components per available unit area. This is of course far from trivial, especially since components such as transistors can influence each other when placed in close vicinity to each other in an active substrate of the die. Such interference is of course highly unwanted. To prevent such interference from occurring, active components in an IC die are typically laterally electrically insulated from each other by isolation regions such as LOCOS (local oxidation of silicon) or STI (shallow trench isolation) regions.

As will be apparent, the inclusion of such isolation regions further complicates increasing the component density. For this reason, the isolation regions have been used as carriers or substrates of (passive) components, e.g. high-voltage resistors, which do not require the use of the active substrate, with the isolation region providing the necessary electrical insulation from the active substrate. A prime example of such a passive component on top of the isolation structure is a polysilicon resistor, the characteristics of which are described in detail in chapter 11.2 of "Device modeling for analog and RF CMOS circuit design" by Trond Ytterdal et. al, published in 2003 by John Wiley and Sons Ltd., Chichester, England.

However, it has been found that the present inventors that the inclusion of passive components such as a polysilicon resistor on an isolation structure in the active substrate can increase the number of die failures.

SUMMARY

There exists a need to provide an integrated circuit die according to the opening paragraph that is more robust against variations in the manufacturing process.

There further exists a need to provide a method of manufacturing such an integrated circuit that having an improved yield and reliability.

According to a first aspect of the present invention, there is provided an integrated circuit die comprising:

an active substrate including a plurality of components laterally separated from each other by respective isolation structures, a plurality of serially connected polysilicon resistors carried by at least some of the isolation structures, wherein the respective portions of the active substrate underneath the isolation structures carrying said polysilicon resistors are electrically insulated from said components.

The present invention is based on the insight that in some cases, vertical cracks in the isolation structures, most notably STI structures, can cause such a crack to become filled with a (semi-)conductive material of the further component on the isolation structure, thereby forming a low resistance path between the further component and the active substrate underneath the isolation structure. Such cracks can for instance form when particles are removed from the STI oxide. Consequently, non-negligible currents can leak from the further component to the active substrate, where such a current can interfere with the correct operation of the components in the (active) regions of the active substrate in between the isolation structures, for instance by biasing the active substrate to an incorrect bias level. Furthermore, the leakage current will cause the behavior of the further component to be incorrect, such that the die comprising such a leakage path will be classified during testing as being faulty, causing the rejection of the die. Equally importantly, die failures can occur over time, thereby reducing reliability and lifetime of the product. In other words, the present invention is based on the discovery that the problem causing yield and reliability issues for such IC dies is the presence of these vertical cracks in the isolation regions, which problem has been solved by electrically insulating the portion of the semiconductor region underneath the isolation regions from the remainder of the semiconductor region, thereby disrupting the current leakage path, such that the behavior of both the components in the active substrate as well as on top of the isolation structures becomes largely insensitive to the existence of a low resistance path through the isolation structure, thereby improving the yield and reliability of the manufacturing process of such dies.

This solution furthermore solved the problem of die failures caused by the presence of substrate pillars through the STI oxide, which can form when a part of the substrate in which the STI trench is to be formed is not properly etched away, which can also provide a leakage current path through the STI region as previously described.

In an embodiment, the active substrate is formed on an electrically insulating layer, such as an oxide layer, such that the die defines a silicon on insulator (SOI) device.

Each of the isolation structures carrying a further component can be surrounded by an electrically insulating guard ring extending through the active substrate. This is a straightforward implementation of such an electrical insulation, which in case of an SOI device ensures that the guard ring defines an electrically insulating container in which the isolation structure is placed, with the insulator layer of the SOI device forming the bottom of that container.

In an embodiment, the guard ring is a medium trench isolation structure.

In a further embodiment, the isolation structures are shallow trench isolation structures. It has been found that in particular STI regions are susceptible to the formation of such vertical cracks.

In yet another embodiment, the respective portions of the active substrate are connected to ground. This further reduces the noise levels to which the passive components are subjected in case of the presence of a noise source in an adjacent region of the active substrate, e.g. a well or drain region.

The IC of the present invention may be advantageously integrated in an electronic device, such as a mobile communication device, (mobile) computing device, an automotive device and so on.

In accordance with another aspect of the present invention, there is provided a method of manufacturing an integrated circuit die, comprising:

providing a carrier;

forming an active substrate on said carrier;

forming a plurality of isolation structures in said active substrate, thereby defining a plurality of active regions laterally separated by said isolation structures;

forming a plurality of components in respective ones of said active regions; forming a plurality of further components on respective ones of said isolation structures; and;

electrically insulating the respective portions of the active substrate underneath said isolation structures from the components.

As previously explained, it has been found that the inclusion of such electrical insulation of the active substrate underneath the isolation structures significantly increases the yield and reliability of the manufacturing process due to the fact that the impact of low resistance paths extending through the isolation structures is neutralized.

In one embodiment, said electrically insulating step comprises forming a plurality of trenches, each of said further trenches surrounding one of said isolation structures carrying a further component, each of said further trenches extending through the active substrate; and filling each of said further trenches with a further electrically insulating material.

The carrier can comprise an electrically insulating material, such that the die is a SOI die.

BRIEF DESCRIPTION OF THE EMBODIMENTS

Embodiments of the invention are described in more detail and by way of non-limiting examples with reference to the accompanying drawings, wherein.

Figure 4:
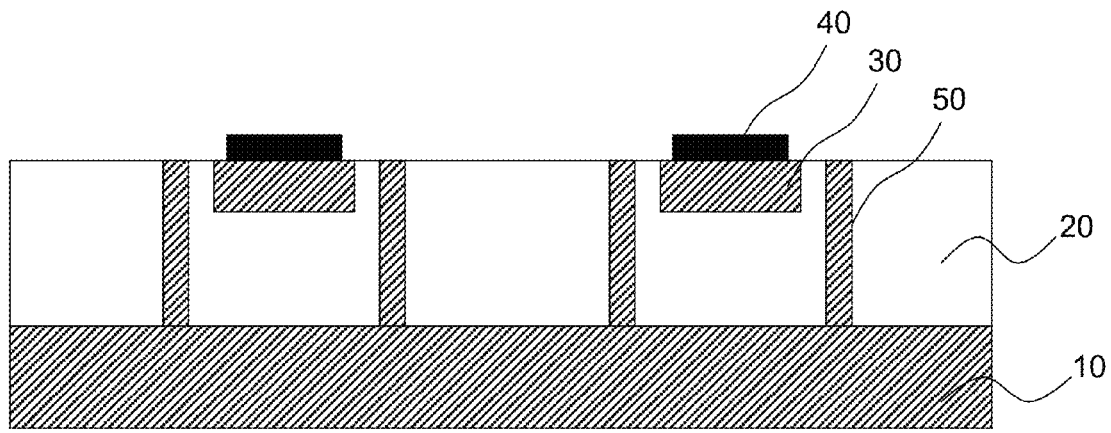
Figure 5:
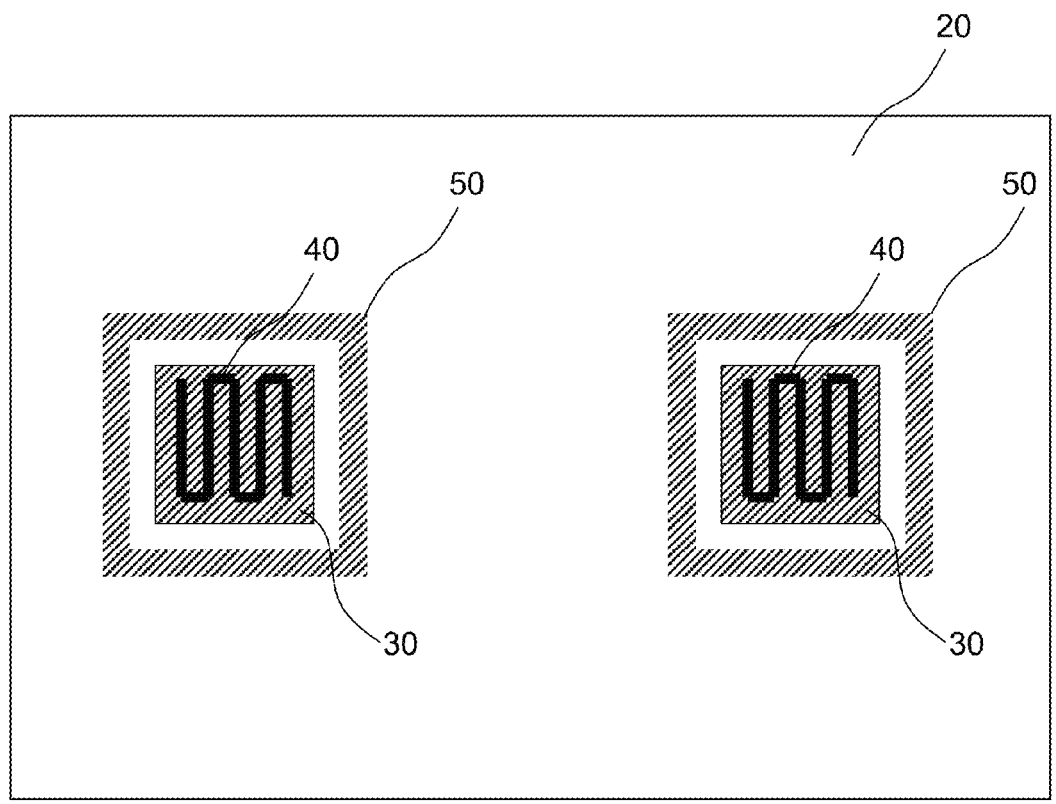
Figure 6:
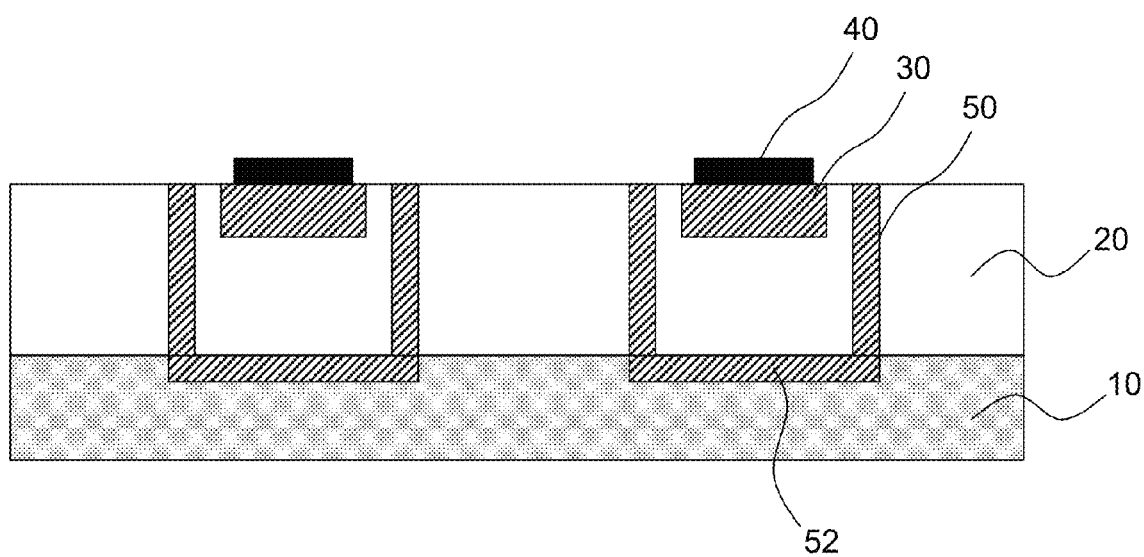
Figure 7:
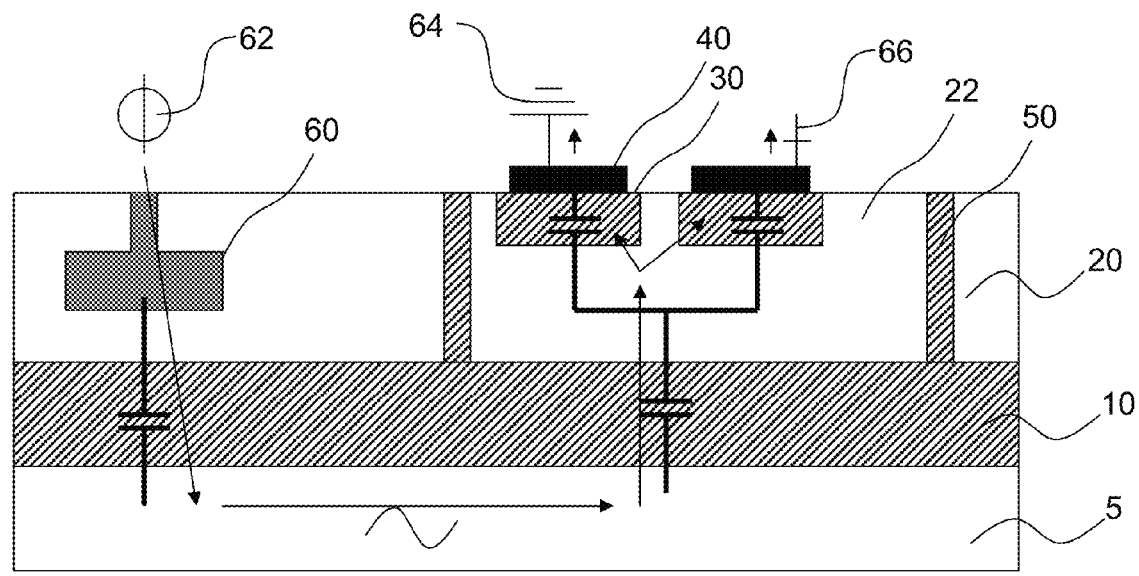
Figure 8:
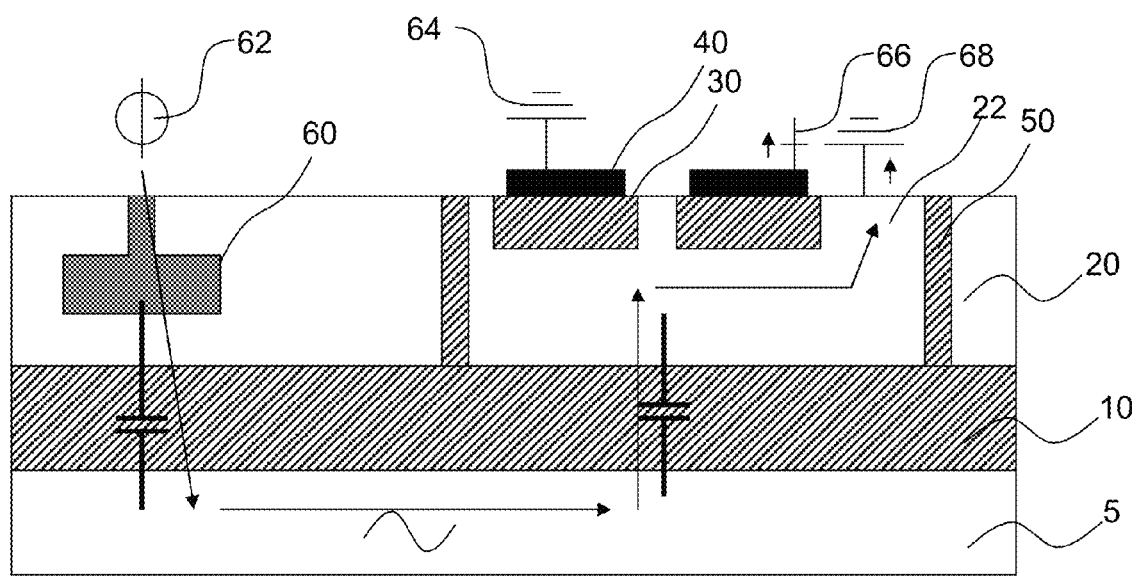

FIG. 4 schematically depicts a cross-section of an integrated circuit die according to an embodiment of the present invention;

FIG. 5 schematically depicts a top view of the integrated circuit die of FIG. 4;

FIG. 6 schematically depicts a cross-section of an integrated circuit die according to another embodiment of the present invention;

FIG. 7 schematically depicts the noise behavior of an integrated circuit die according to an embodiment of the present invention; and FIG. 8 schematically depicts the noise behavior of an integrated circuit die according to another embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

Figure 1:
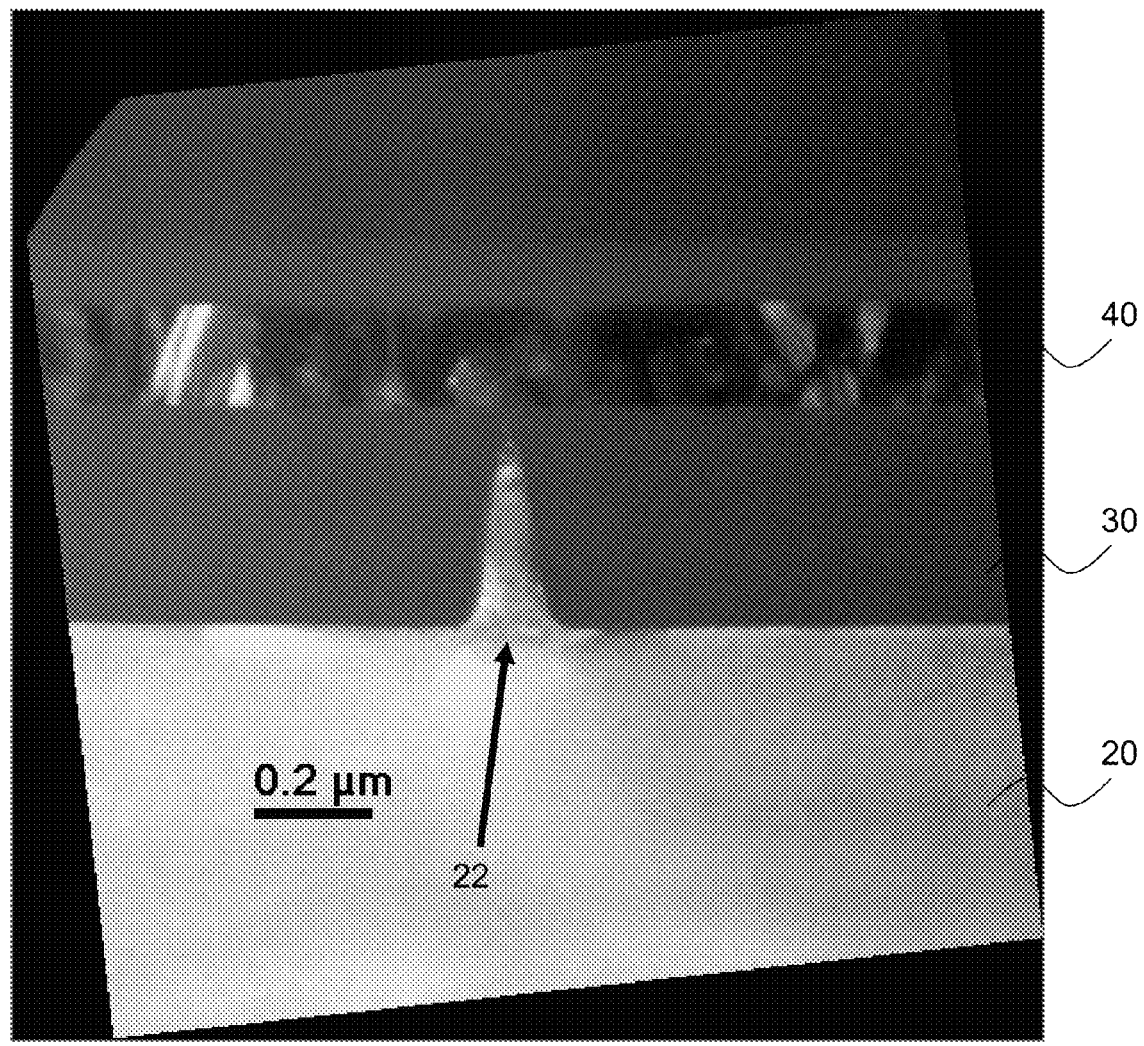
FIG. 1 depicts a scanning electron microscopic image of a first type of defect in a shallow trench isolation region.

FIG. 1 depicts a part of an integrated circuit die comprising an epitaxially grown silicon layer 20, which forms the active substrate of the die. A 250 nm thick STI region 30 is formed on the silicon layer 20, on top of which a polysilicon passive component 40, e.g. a high-voltage (HV) resistor is formed. It has been recognized by the present inventors that certain types of defects can occur if the STI region 30 (or a similar isolation structure such as a LOCOS structure) is used as a carrier for a current-handling component such as a resistor.

STI regions are typically formed by a silicon etch and subsequent trench infill with $SiO_2$. During the silicon etch, particles or other defects in the silicon may prevent the completion of the etch step, thus leaving behind a silicon pillar inside the etched trench, which can act as a low-resistance path between the active substrate path 20 and the current-handling component 40. Similar phenomena can happen in LOCOS isolation structures. LOCOS is typically formed by thermal oxidation of silicon, where such particles or other defects can prevent the complete oxidation of the silicon region.

Figure 2:
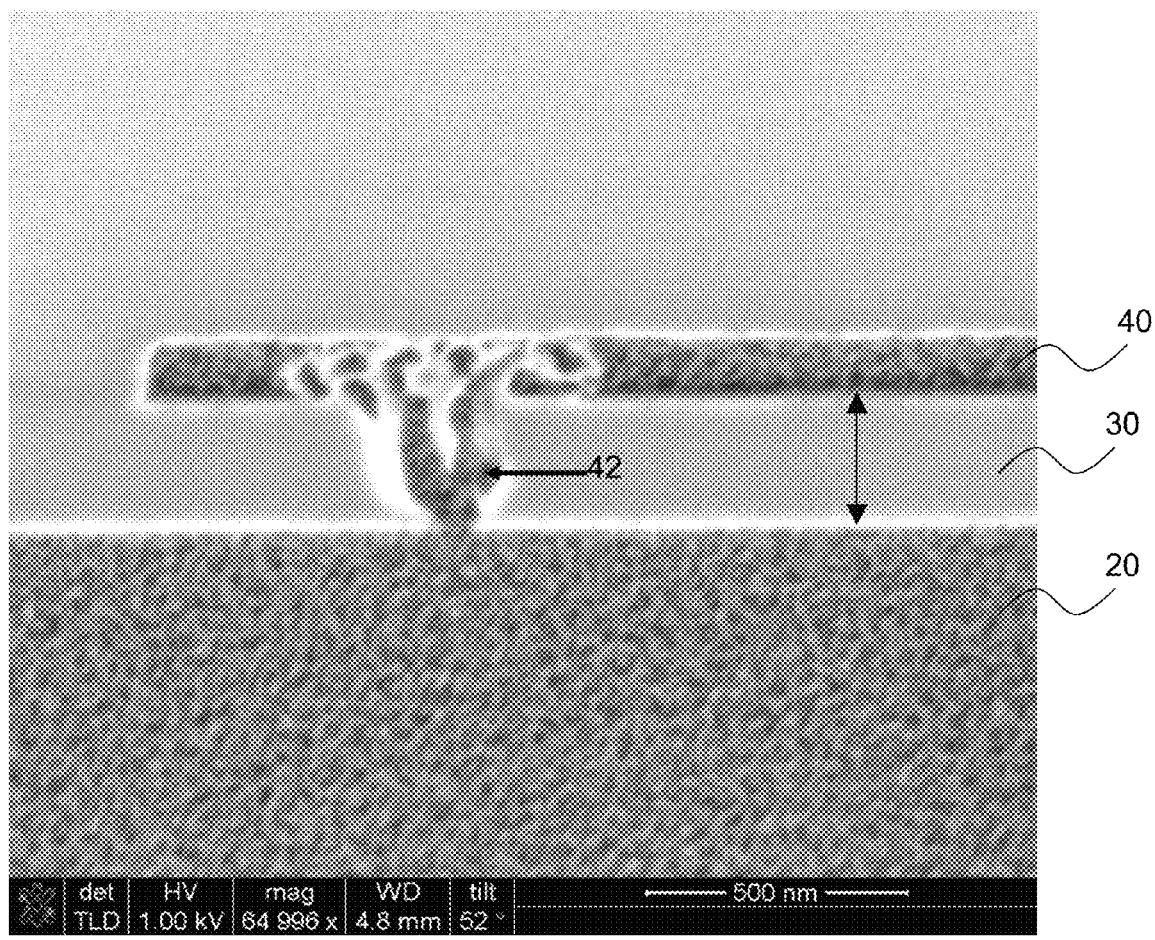
FIG. 2 depicts a scanning electron microscopic image of a second type of defect in a shallow trench isolation region.

A second type of defect is shown in FIG. 2, where a pillar 42 of the material of which the component 40 is made penetrates, i.e. fills a crack or void of, the isolation structure 30, where it forms a low resistance path between the active substrate path 20 and the current-handling component 40. Such a pillar 42 may for instance be formed during the deposition (e.g. epitaxial growth) of the polysilicon on top of the isolation region 30.

Figure 3:
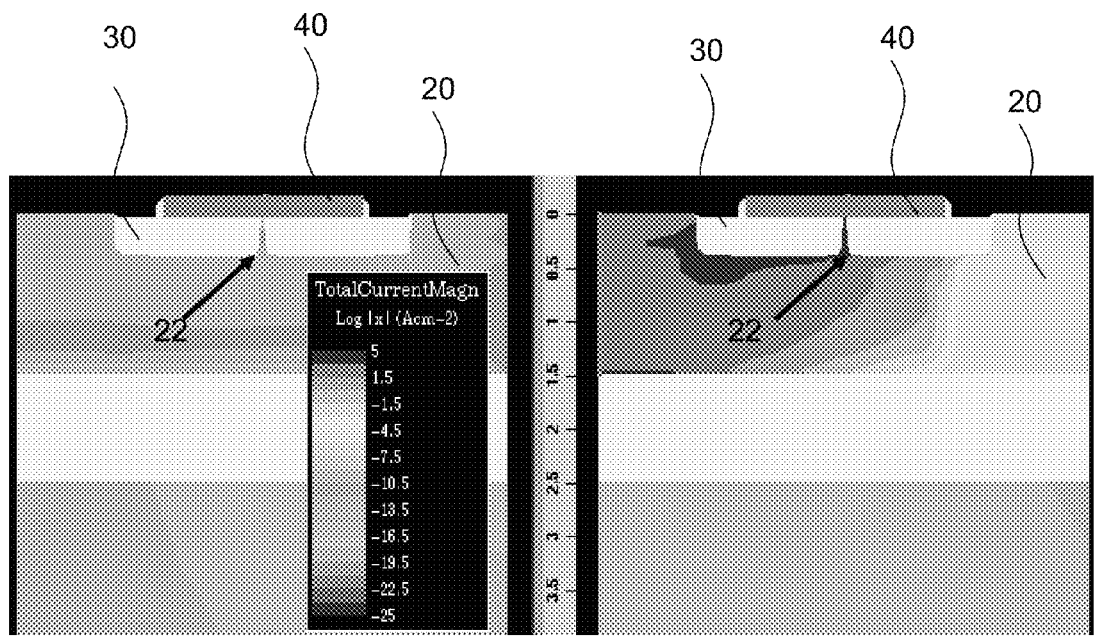
FIG. 3 depicts a simulation result of the effect of such a defect on the current leaking through the shallow trench isolation region.

The effect of such a defect is shown in FIG. 3, which depicts a TCAD simulation of the current flow through the passive component 40 of a SOI device in which the active substrate 20 is formed on an insulating carrier such as a $SiO_2$ carrier. The left hand panel shows the simulation result of a SOI device in which the active substrate 20 is left floating, whereas the right hand panel shows the simulation result of a SOI device in which the active substrate 20 is connected to a bias contact such as ground. It is apparent from the right hand panel that as soon as the active substrate 20 becomes connected to a defined voltage potential such as ground, a significant leakage current path is formed through the pillar 22 and the active substrate 20, thereby causing a failure of the IC die in the sense that the die will not behave within allowable tolerances.

Such significant leakage currents are not only observed when subjecting the passive component 40 to high voltages. Non-negligible leakage currents have also been observed at voltages of less than 10V applied to a polysilicon resistor on top of the isolation region 30.

In accordance with an aspect of the present invention, an IC die is provided in which the part of the active substrate 20 underneath such a isolation structure 30 is electrically insulated from the remainder of the active substrate 20, such that when a contact such as a bias or ground contact is present in the active substrate 20, the electrical insulation prevents the formation of a current path from the defect in the isolation region 30, e.g. the STI region, to the contact. It has been found that this is a more promising approach than trying to prevent the occurrence of such defects, which may require significant alterations to the manufacturing process of the IC die, which is therefore unlikely to be cost-effective.

FIG. 4 shows a cross-section and FIG. 5 shows a top view of an embodiment of the present invention in which the active substrate 20 underneath a shallow trench isolation region 30 carrying a (passive) component 40 such as a HV polysilicon resistor or another component comprising polysilicon is electrically insulated from the remainder of the active region 20. To this end, the STI region 30 is ring-fenced by an electrically insulating guard ring 50, which may be made of the same material as the STI region (or other suitable type of isolation region) 30, e.g. a silicon oxide such as $SiO_2$, or may be made of a different electrically insulating material. In FIG. 4, the IC die is a SOI device further comprising an electrically insulating carrier 10, e.g. a $SiO_2$ carrier. Preferably, the guard ring 50 extends through the active substrate 20 onto the electrically insulating layer 10, such that the combination of the guard ring 50 and the portion of the electrically insulating layer 10 delimited by the guard ring 50 define an electrically insulating container in which the portion of the active substrate 20 underneath the isolation region 30 is contained.

In an embodiment, the guard ring 50 is formed as a medium trench isolation (MTI), which may have a depth in excess of 1 micrometer, e.g. 1.5 micrometer. Such a trench may be formed by subjecting exposed portions of the active substrate 20 to a suitable etch recipe stopping at the underlying electrically insulating layer 10, followed by an oxide growth step. As such process steps are well-known per se further details will not be provided for the sake of brevity only.

It is noted that the active substrate 20 may be made of any suitable semiconducting material, e.g. epitaxially grown silicon, silicon germanium and so on. The active substrate 20 typically comprises a contact (not shown) that would cause a leakage current to form between the component 40 and the contact in the presence of an aforementioned defect in the isolation region 30 and in the absence of the electrical insulation in accordance with the present invention. Active regions laterally separated from each other by the STI regions 30 typically comprise passive or active components, e.g. transistors. They have not been shown for the sake of clarity as the nature of these components has no bearing on the present invention.

The present invention is not limited to SOI devices. FIG. 6 schematically depicts an alternative embodiment in which the active substrate 20 may be grown on a carrier layer 10 such as a silicon wafer. In this case, a further electrical insulation portion 52 delimited by the guard ring 50 may be formed in or on the carrier layer 10 to complete, i.e. form the bottom of, the electrically insulating container that contains, i.e. ring-fences, the portion of the active substrate 20 underneath the isolation structure 30. Other suitable electrical insulation solutions for this portion of the active substrate 20 will be apparent to the skilled person.

It will be apparent that the IC dies of FIGS. 4 and 6 may be manufactured using routine processing steps. For instance, the active substrate 20 may be formed on the carrier 10 in any suitable manner, e.g. though epitaxial growth, and the plurality of isolation structures 30 may be formed in any suitable in said active substrate 20, e.g. by forming STI regions 30 or LOCOS regions 30, which is known per se to the skilled person.

The components in the active regions and the further components 40 on respective ones of the isolation structures 30 may also be formed in any suitable manner, for which many variations are immediately apparent to the skilled person, whereas the electrical insulation of the respective portions of the active substrate 20 underneath the isolation structures 30 may also be achieved using routinely available processing steps, such as the formation a plurality of trenches each surrounding one of the isolation structures 30 through etching and filling the further trenches with a further electrically insulating material such as $SiO_2$ to form the guard rings 50 as previously explained.

FIG. 7 schematically depicts the noise behavior of an embodiment of the IC die of the present invention, in which the n-well 22 of active substrate 20 comprises two isolation structures 30. The n-well 22 has been left floating. An active structure such as a drain region 60 is present in a neighboring portion of the active substrate 20, e.g. a neighboring n-well region, which is electrically insulated from the n-well region 22 by the electrically insulating guard ring 50 and an insulating layer 10 on a handle wafer 5. In other words, the IC die is of the SOI type, although it is reiterated that this is shown by way of non-limiting example only.

The isolation structures 30 each carry a passive component 40, e.g. a polysilicon resistor, one of which is connected to ground 64 and the other being connected to a supply source 66. In operation, the drain region 60 can be subjected to a noise source 62. The presence of the guard ring 50 prevents the passive components 40 from being subjected to excessive noise levels, as the noise path, indicated by the arrows in FIG. 7 can only reach the passive components 40 via the parasitic capacitances that have been indicated in FIG. 7, i.e. the capacitance between the n-well including the drain region 60 and the handle wafer 5 separated by the insulating layer 10, the capacitance between the n-well 22 and the handle wafer 5 separated by the insulating layer 10, and the capacitance between the n-well 22 and the passive components 40 separated by the isolation structures 30, or the low-ohmic path through the isolation structures 30 as previously explained.

FIG. 8 shows the noise behavior of an IC die according to another embodiment of the present invention. FIG. 8 differs from FIG. 7 in that the n-well 22 has been electrically connected to ground 68 rather than left floating. This has the additional advantage that any noise injected into the device by noise source 62 via the drain region 60, which finds its way into the n-well region 22 via the capacitive paths as described with the aid of FIG. 7 bypasses the passive components 40, e.g. polysilicon resistors, thereby even more effectively shielding the passive components 40 from such injected noise.

In addition or alternative to the solution shown in FIG. 8, the region of the active substrate 20 comprising the drain region 60 may be grounded to prevent noise from reaching n-well 22. In case of the passive components 40 comprising (poly-Si) resistors, the resistors may be split into multiple resistors having smaller resistance values (e.g. a 100Ω resistor may be divided up into four serially connected 25Ω resistors) to reduce the effect of the residual noise on the performance of the resistors.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit die comprising an active substrate including a plurality of components laterally separated from each other by respective isolation structures, a plurality of serially connected polysilicon resistors carried by at least some of the isolation structures;

wherein each of the isolation structures carrying a serially connected polysilicon resistor is surrounded by an electrically insulating guard ring extending through the active substrate;

wherein the respective portions of the active substrate underneath the isolation structures carrying said polysilicon resistors are electrically insulated from said components.

2. The integrated circuit die of any of claim 1, wherein the active substrate is formed on an electrically insulating layer.

3. The integrated circuit die of claim 1, wherein the guard ring is a medium trench isolation structure.

4. The integrated circuit die of claim 1, wherein the respective portions of the active substrate are connected to ground.

5. The integrated circuit die of claim 1, wherein the active substrate further comprises a contact terminal, said contact terminal being electrically insulated from said respective portions.

6. An electronic device comprising the integrated circuit die of claim 1.

7. A method of manufacturing an integrated circuit die, comprising:

providing a carrier;

forming an active substrate on said carrier;

forming a plurality of isolation structures in said active substrate, thereby defining a plurality of active regions laterally separated by said isolation structures;

forming a plurality of components in respective ones of said active regions;

forming a plurality of serially connected polysilicon resistors on respective ones of said isolation structures; and electrically insulating the respective portions of the active substrate underneath said isolation structures from the components;

wherein said electrically insulating step comprises:

forming a plurality of trenches, each of said further trenches surrounding one of said isolation structures carrying a polysilicon resistor, each of said further trenches extending through the active substrate; and filling each of said further trenches with a further electrically insulating material.

8. The method of claim 7, wherein the further electrically insulating material comprises silicon oxide ($SiO_2$).

9. The method of claim 7, wherein the carrier comprises an electrically insulating material.

* * * * *